United States Patent
Sinha et al.

(10) Patent No.: US 6,852,627 B2
(45) Date of Patent: Feb. 8, 2005

(54) CONDUCTIVE THROUGH WAFER VIAS

(75) Inventors: Nishant Sinha, Boise, ID (US); Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/379,890

(22) Filed: Mar. 5, 2003

(65) Prior Publication Data

US 2004/0173909 A1 Sep. 9, 2004

(51) Int. Cl.⁷ ................................................. H01L 21/44
(52) U.S. Cl. .................... 438/687; 438/23; 438/618; 257/622; 73/204.28
(58) Field of Search .................... 438/23, 618; 257/622; 73/204.28

(56) References Cited

U.S. PATENT DOCUMENTS

| | | | |
|---|---|---|---|
| 5,024,966 A | * 6/1991 | Dietrich et al. | 438/23 |
| 5,949,141 A | 9/1999 | Farnworth et al. | 257/737 |
| 5,998,292 A | * 12/1999 | Black et al. | 438/618 |
| 6,032,527 A | * 3/2000 | Genova et al. | 73/204.26 |
| 6,221,769 B1 | 4/2001 | Dhong et al. | 438/667 |
| 6,242,103 B1 | 6/2001 | Farnworth et al. | 428/458 |
| 6,268,660 B1 | 7/2001 | Dhong et al. | 257/774 |
| 6,270,601 B1 | 8/2001 | Ritland et al. | 156/89.12 |
| 6,294,837 B1 | 9/2001 | Akram et al. | 257/774 |
| 6,333,555 B1 | 12/2001 | Farnworth et al. | 257/737 |
| 6,359,328 B1 | * 3/2002 | Dubin | 257/622 |
| 6,400,172 B1 | 6/2002 | Akram et al. | 324/765 |
| 6,413,862 B1 | 7/2002 | Farnworth et al. | 438/686 |
| 6,441,479 B1 | 8/2002 | Ahn et al. | 257/700 |
| 6,444,110 B2 | 9/2002 | Barstad et al. | 205/123 |
| 6,465,877 B1 | 10/2002 | Farnworth et al. | 257/668 |
| 2001/0024129 A1 | 9/2001 | Akram et al. | 324/765 |
| 2002/0098711 A1 | 7/2002 | Klein | 438/758 |
| 2002/0109233 A1 | 8/2002 | Farrar | 257/762 |
| 2003/0080408 A1 | 5/2003 | Farnworth et al. | 257/698 |

OTHER PUBLICATIONS

U.S. patent application Ser. No. 10/267,822, filed Oct. 9, 2002, Sinha.

* cited by examiner

*Primary Examiner*—David Nelms
*Assistant Examiner*—Mai-Huong Tran
(74) *Attorney, Agent, or Firm*—Whyte Hirschboeck Dudek SC

(57) ABSTRACT

Methods for fabricating a conductive contact (through-via) through a full thickness of a substrate such as a semiconductor wafer or interposer substrate, and semiconductor devices and systems incorporating the conductive through-via are provided. The conductive contact is fabricated by applying a metal layer onto a backside of a substrate, forming a through-hole through the substrate and the metal layer, sealing the hole in the metal layer by an electroless plating process, and filling the hole by an electroplating or an electroless plating process.

51 Claims, 5 Drawing Sheets

CONDUCTIVE THROUGH WAFER VIAS

FIELD OF THE INVENTION

The invention relates generally to semiconductor fabrication, and more particularly to methods for providing interconnects from one surface to the opposite surface of a substrate for making electrical connections with semiconductor components, and more particularly to methods for filling a through-via in a wafer, interposer or other substrate with a conductive material.

BACKGROUND OF THE INVENTION

Interposers are utilized for interfacing two electrical components, for example, a semiconductor device and a printed circuit board, or a semiconductor wafer and a probe card for testing of the dies on the wafer. These interposers may comprise silicon or ceramic substrate that include metal-filled vias that extend through the interposer from one side to the opposite side. The metal-filled via provide electrical communication between conductive structures disposed on the opposing surfaces of the interposer, which align with contact pads or other structures of the electrical components to establish electrical connection between the two components.

Continued miniaturization of integrated circuits results in contact vias having increasingly higher aspect ratios (defined as the ratio of height to width of the via).

Conventional methods of filling a through-via using a plasma chemical vapor deposition (PCVD) process to form a seed layer followed by a conformal metal electroplating process are limited to low aspect ratio openings. As is known in the art, high aspect ratio vias are difficult to fill conformally, that is, without forming voids or keyholes that can adversely affect conductivity of the contacts.

SUMMARY OF THE INVENTION

The present invention provides methods for fabricating a conductive contact (through-via) through the full thickness of a semiconductor wafer, interposer, or other substrate, and semiconductor devices and systems incorporating the conductive through-via.

One embodiment of a method of forming a conductive contact according to the invention comprises applying a layer of metal onto a first surface of a substrate, forming an opening through the substrate and the metal layer, electroless plating a metal to fill the opening through the metal layer, and plating a metal to fill the opening in the substrate. The metal layer can be applied to the backside surface of the substrate by various processes including deposition processes, adhering a metal sheet, among others. The gap formed in the metal layer is sealed by an electroless plating process, and the opening in the substrate is filled with metal deposited by an electroplating or electroless plating process. In embodiments in which the substrate is a semiconductive material (e.g., silicon), an isolation layer can be formed onto sidewalls of the substrate within the opening prior to the metal plating steps. The process of the invention results in a conductive contact that is without voids or keyholes.

In another aspect, the invention provides a semiconductor device. In various embodiments, the device comprises a conductive through-via according to the invention disposed through a substrate.

In one embodiment, the device comprises the conductive through-via in process, which comprises a layer of metal disposed on a surface of a substrate and an opening through the substrate and the metal layer. In another embodiment, the device comprises a metal layer disposed on a surface of a substrate, an opening through the substrate and the metal layer, and a plated metal disposed in the opening of the metal layer. In yet another embodiment, the device comprises a metal layer disposed on a surface of a substrate, an opening through the substrate and the metal layer, an electrolessly plated metal sealing in the opening (gap) in the metal layer, and a plated metal fill disposed in the opening in the substrate to form a conductive contact.

The device can comprise a semiconductor wafer, an interposer, or other substrate comprising the conductive through-via, or the conductive through-via in process.

Another aspect of the invention is a system comprising a microprocessor in communication with a memory device comprising the conductive through-via of the invention.

The invention advantageously provides a simplified method of forming through-wafer vias that are void-free. The present method involves fewer process steps than prior art methods, provides a cost savings in the production. Additionally, the process achieves a solid fill contact by depositing metal upward from the base of the opening rather than by conformal plating or deposition by vapor.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 1 illustrates a processing step forming a metal layer on a surface of the substrate.

FIG. 2 shows formation of openings through the substrate and the metal layer.

FIG. 3 shows formation of an isolation layer on the sidewalls of the openings and the surface of the substrate.

FIGS. 4–6 depict sequential processing steps to electroless plate a conductive metal in the gap in the metal layer.

FIGS. 7–8 illustrate sequential electroplating process steps to deposit metal in the opening to form the conductive contact.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in fabricating a conductive through-via in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above, and interposer substrates, among others.

The invention provides methods for filling a through-via that is formed through the thickness of a wafer or other substrate with a conductive metal. The conductive via is disposed in a substrate comprising an opening extending from the first surface to the second surface and at least partially filled with a conductive material. The conductive vias can be used for interconnecting contacts on a component, for example, a contact pad on one side of a substrate (e.g., interposer) to a conductive element such as a contact pad on the opposing side of the substrate, among other uses.

Figure 1:
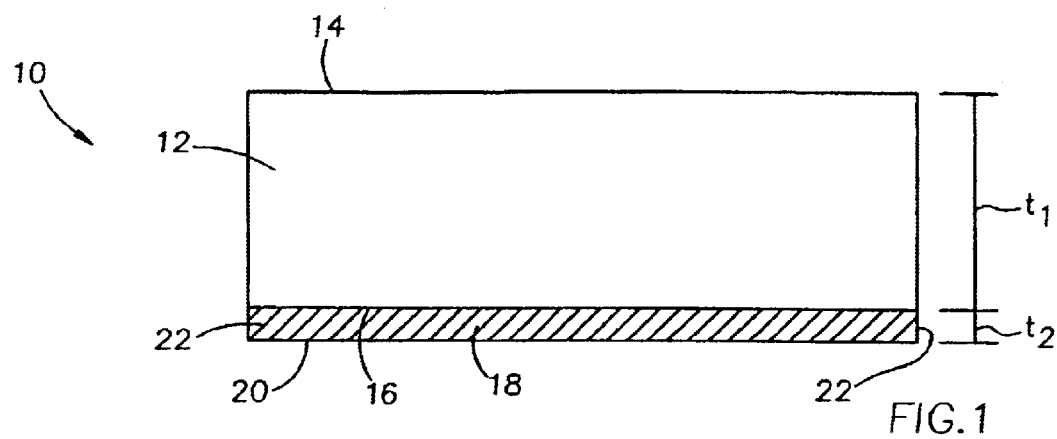
FIGS. 1–8 are diagrammatic cross-sectional views of a fragment of a semiconductor substrate at sequential processing steps showing fabrication of a conductive contact according to an embodiment of the method of the invention.

Steps in an embodiment of a method for fabricating a conductive through-via in a semiconductor device 10 according to the invention are illustrated in FIGS. 1–8. Initially, as shown in FIG. 1, a substrate 12 comprising opposing first and second surfaces 14, 16, and a thickness $t_1$ is provided. The substrate 12 can comprise an unprocessed semiconductor wafer or other substrate, the wafer with various process layers formed thereon including one or more semiconductor layers or other formations and active or operable portions of semiconductor devices fabricated through etching, deposition, or other well known techniques, an interposer substrate for use between a test substrate and a semiconductor device to be tested or between a memory device and system in a package to provide routing, among other substrates. An exemplary thickness $t_1$ of the substrate is about 28 mil, which can be about 8 to about 32 mil.

In the illustrated example, the substrate 12 comprises a semiconductive material such as monocrystalline silicon, polycrystalline silicon, germanium, silicon-on-glass, or silicon-on-sapphire, for example, but can also comprises a non-conductive (electrically insulating) material such as a ceramic, a plastic or polymer material such as bismaleimide triazine (BT) resin, a glass filled epoxy resin material such as such as FR-4 or FR-5 laminates, and an aramid-filled resin, for example, among other materials that are used as substrates in fabricating semiconductor devices and carrier substrates.

As shown in FIG. 1, a layer 18 of conductive metal is applied onto the second surface 16 of the substrate 12. The conductive metal layer 18 can comprise nickel, copper, aluminum, palladium, platinum, or silver, for example. The metal layer 18 can be fabricated by known metallization techniques, such as by chemical vapor deposition (CVD), physical vapor deposition (PVD) (e.g., sputtering), evaporation using a conventional metal evaporator, electroless plating, and electroplating, for example, to deposit a blanket layer of metal over the substrate. A pre-fabricated metal sheet or foil can also be adhered or laminated to the substrate using an adhesive material. As depicted, the metal layer includes an exposed (bottom) surface 20 and sidewalls 22.

The thickness $t_2$ of the metal layer 18 can range from a thin seed layer of about 0.2 to about 0.5 $\mu$m to a thicker layer of up to about 2 $\mu$m. Preferably, the thickness $t_2$ of the metal layer 18 is about one-tenth of the radius ($r_1$) of the gap 26 that is subsequently formed in the metal layer 18 (FIG. 2).

Figure 2:
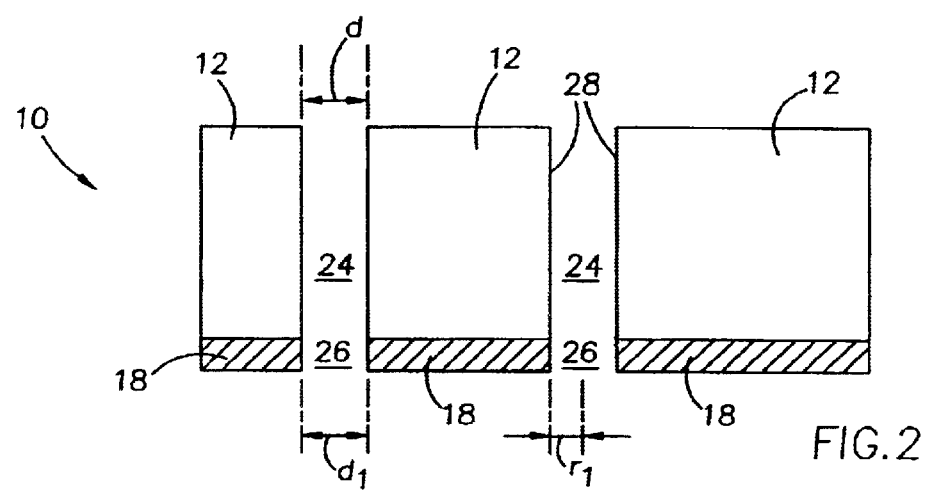

Next, as shown in FIG. 2, one or more contact openings or via holes 24 are formed through the entire thickness $t_1$, $t_2$ of the substrate 12 and the metal layer 18, creating an opening or gap 26 in the metal layer. The openings 24 can be formed using a variety of fabrication techniques known in the art and appropriate to the substrate, including, for example, a dry etch utilizing photolithographic processing, or photochemical processing. The openings can also be formed using a laser machining (drilling) process, as described, for example, in U.S. Pat. No. 6,400,172 (Akram et al.). The openings 24 include sidewalls 28, and generally have a diameter (d) of about 0.17 to about 0.90 $\mu$m, typically less than about 0.40 $\mu$m, with substrates ranging in thickness from about 10 $\mu$m to about 725 $\mu$m, typically about 250 $\mu$m, resulting in an aspect ratio of about 42 to about 1 down to about 0.11 to 1, typically greater than about 6.25.

Following formation of the openings 18, a clean step can be performed to remove residual materials from the openings. Such a clean step can be performed, for example, by wet etching or stripping a sacrificial layer.

Figure 3:
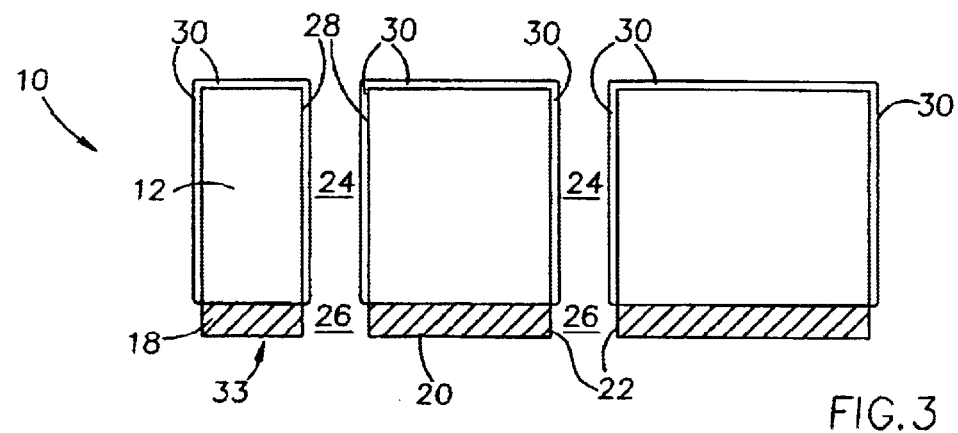

As shown in FIG. 3, an isolation layer 30 can be formed on the sidewalls 28 within the openings 24 and on the first surface 12 of the substrate 12 by known techniques in the art. The isolation layer 30 can comprise a dielectric or insulative material such as an oxide (e.g., silicon dioxide ($SiO_2$)), nitride (e.g., silicon nitride ($Si_3N_4$)), or an oxynitride, for example, or a glass such as borophosphosilicate glass (BPSG), phosphosilicate glass (PSG), or borosilicate glass (BSG). The isolation layer can be formed to a desired thickness using, chemical vapor deposition (CVD), low pressure chemical vapor deposition (LPCVD), rapid thermal nitridation (RTN), spin-on-glass (SOG) process, flow coating, or other process. The isolation layer 30 can also comprise an insulating polymer, such as BT resin, polyimide, benzocyclobutene (BCB), and/or polybenzoxazole (PBO), for example, deposited using an injection or capillary process or vacuum draw. A representative thickness of the isolation layer is about 1–5 $\mu$m. If the substrate 12 is formed of an electrically insulating material (e.g., ceramic), the isolation layer can be eliminated.

Figure 4:
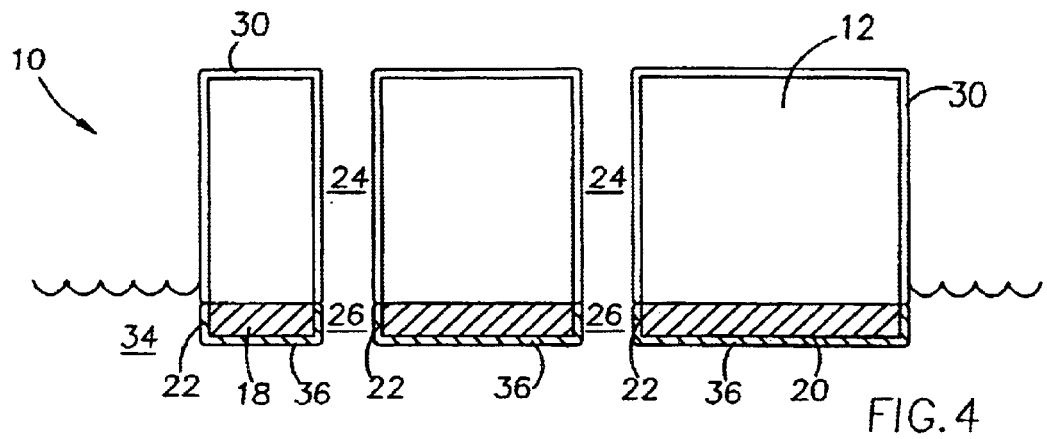
Figure 5:
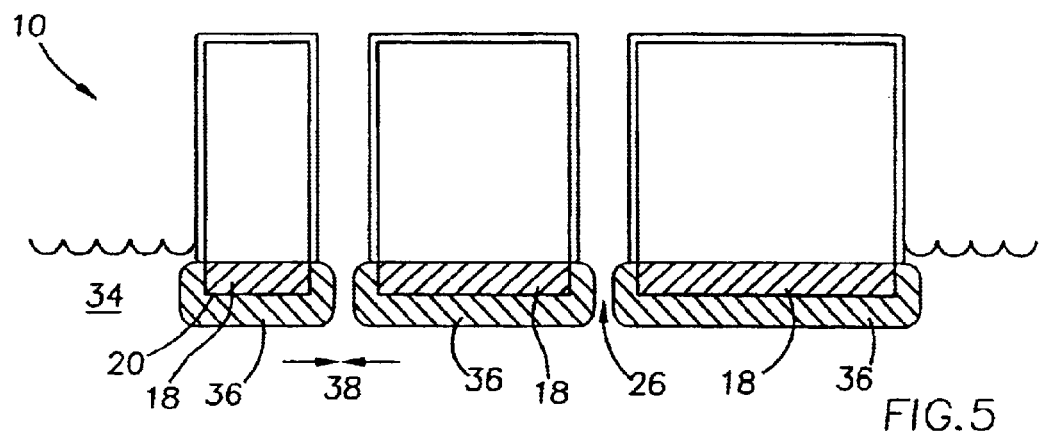
Figure 6:
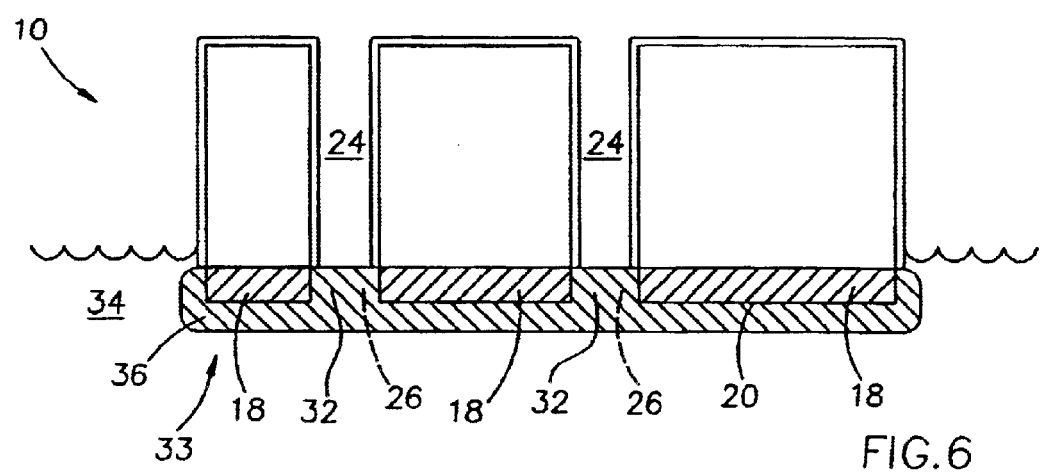

As shown in FIGS. 4–6, a conductive metal is then deposited to fill and seal the gap 26 in the metal layer 18 and short the metal layer together. According to the invention, a metal fill or plug layer 32 is fabricated by plating a conductive metal onto the sidewalls 22 of the metal layer 18 within the gap 26 using an electroless deposition (i.e., electroless plating, electrochemical deposition) process. The process of electroless plating of a metal generally comprises dipping the semiconductor element with the exposed metal layer into a solution including at least one inorganic metal salt and at least one agent that reduces the metal salt (reducing agent), wherein the metal selectively bonds or plates on the metal layer to a desired thickness.

Using an electroless deposition process, metal is deposited onto the sidewalls (edge, rim) 22 of the metal layer 18 within the gap 26, and on the exposed surface 20 of the metal layer 18 on the backside 33 of the substrate 12, by dipping at least the metal layer 18 into an electroless plating solution 34. Referring to FIGS. 4–5, as the plating progresses, there is a uniform build-up of metal 36 from the plating solution 34 onto the sidewalls 22 of the metal layer 18 resulting in the inward growth (arrows 38) of the metal layer 18 to fill the gap 26 and the formation of the plug layer 32, which effectively seals the gap 26. There is a corresponding build-up of metal 36 onto the exposed (bottom) surface 20 of the metal layer 18 on the backside 33 of the substrate 12.

For example, a metal layer 18 having a thickness $t_2$ of about 2 μm can be applied onto the surface 16 of the substrate 12, and a contact opening 24 can be formed in the substrate through the metal layer 18 forming a gap 26 having a diameter $d_1$ of about 50 μm (or radius $r_1$ of about 25 μm). Plating can then be performed, whereby a buildup of metal 36 to a thickness of about 25 μm on the exposed surfaces 20 (including the sidewalls 22) of the metal layer 18 will form a plug 32 to fill the gap 26 (FIG. 6), and increase the thickness $t_2$ of the metal layer 18 on the backside 33 of the substrate 12 to about 27 μm (about the radius $r_1$).

A conventional electroless plating process can be used. Exemplary metals include copper, nickel, cobalt, palladium, platinum, and silver. Electroless plating tools and solutions for electrolessly plating these metals are known in the art. For example, for electroless depositing nickel, the metal solution can comprise nickel chloride and a chemical reducing agent such as sodium hydroxyacetate and sodium hypophosphate at a temperature of about 85° C. to about 90° C. For depositing palladium, the metal solution can comprise palladium chloride and a chemical reducing agent such as sodium hypophosphate at a temperature of about 50° C. to about 60° C. For depositing silver, the solution can comprise a silver salt such as $AgNO_3$ or $KAg(CN)_2$, and a chemical reducing agent such as potassium hypophosphite, among others.

The thickness of the plug layer 32 within the gap 26 is controlled by the concentration of the metal plating solution 34 and the length of time that the metal layer 18, 36 is immersed in the aqueous solution 34. To terminate the electroless deposition, the metal layer is removed and rinsed.

Next, a conventional electroplating or electroless plating process is used to deposit a conductive metal into the openings 24 onto the plug layer 32 to fill the opening 24 and form a conductive contact 40. Electroplating and electroless plating tools and plating solutions are known in the art and commercially available.

Generally, in an electroplating process, a substrate is submerged in a plating bath comprising metal ions. A current is applied to reduce the metal ions within the plating solution and metal deposits onto exposed metal surfaces on the substrate. The substrate remains submerged in the solution bath and the current is applied until a desired thickness of metal is deposited. The current is then terminated and the substrate is placed into a rinse bath to remove residual bath liquid and particles from the surface.

Figure 7:
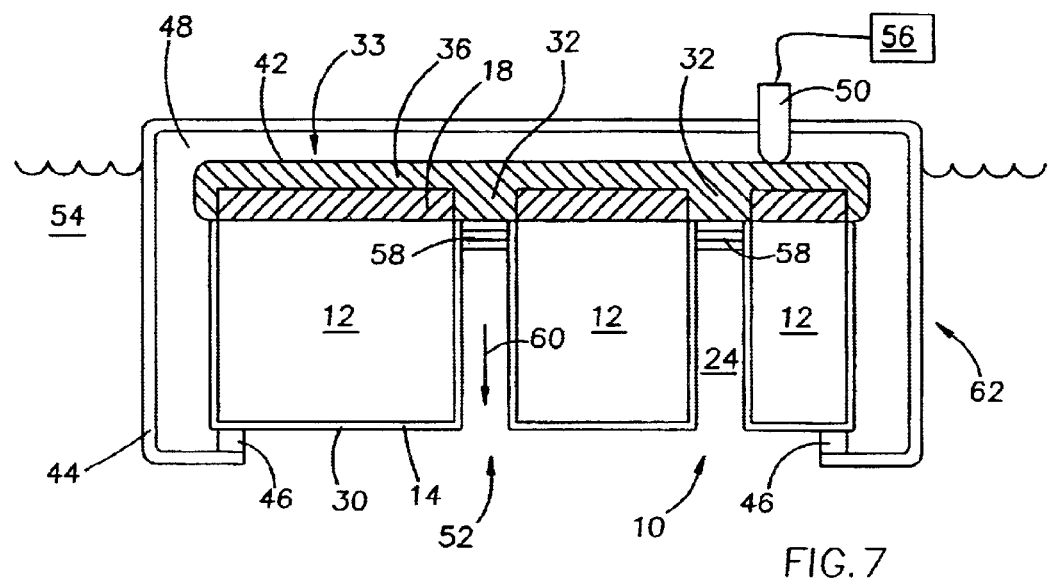
Figure 8:
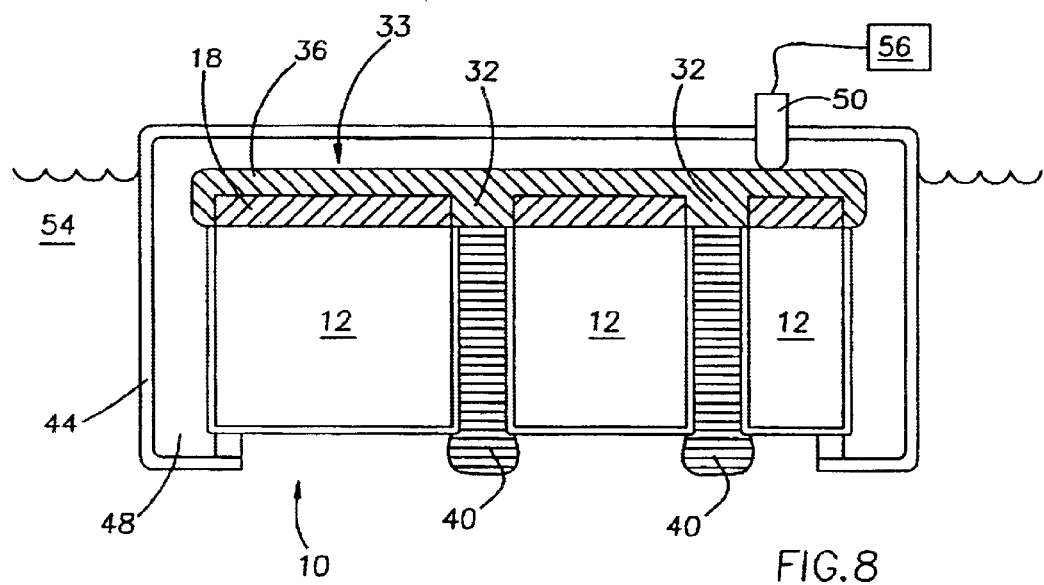

In an electroplating process according to the invention, the exposed surface 42 of the metal layer 36 on the backside 33 of the substrate 12 is sealed or covered to prevent further metal deposition thereon, and the openings 24 are uncovered. For example, as depicted in FIG. 7, the substrate 12 can be housed within a container 44 with sealing members 46 (e.g., rubber seals) disposed on the insulating layer 30 over the first (front side) surface 14 of the substrate 12, with the openings 24 exposed. As shown, a volume of gas 48 such as air or nitrogen ($N_2$) is disposed within the container 44 about metal layer 36 on the backside 33 of the substrate 12. According to the method, an electrode 50 is placed into contact with the surface 42 of the metal layer 36, and the front side 52 of the substrate 10 is immersed into an electroplating solution 54. A current from an energy source 56, for example, a battery, is applied through the electrode 50 to the metal layer 36, and metal deposits from solution onto the metal plug layer 32 within the opening 24 to form a metal layer 58. The metal plates upward from the plug layer 32 in the direction of arrow 60 to fill the opening 24, resulting in the conductive metal contact 40 shown in FIG. 8. The current to the electrode 50 is then terminated.

Figure 9:
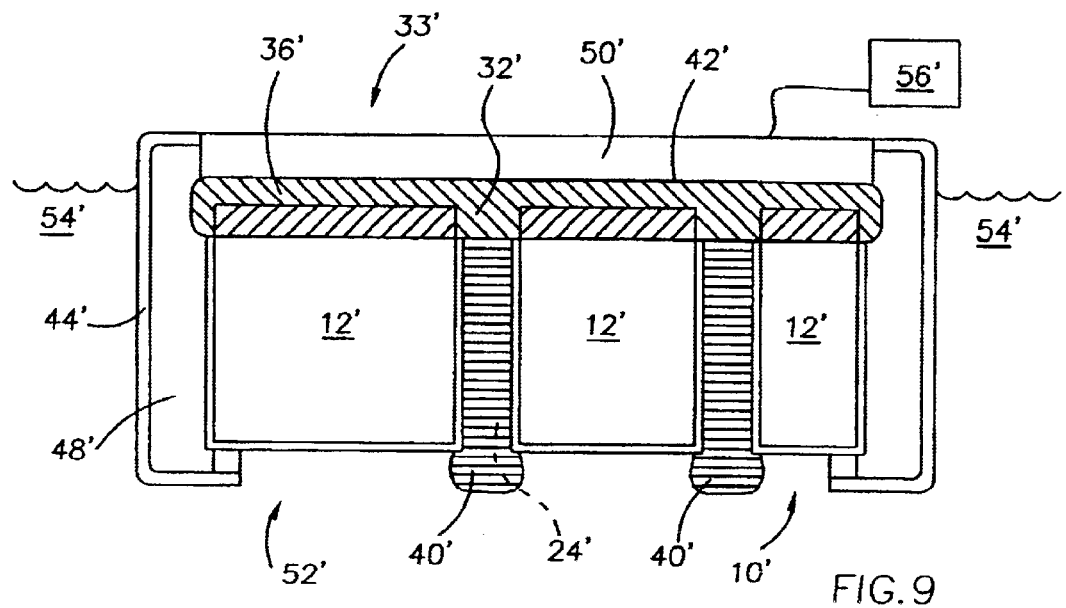
FIG. 9 illustrates in another embodiment of an electroplating process step to fill multiple openings in the substrate according to the invention.

FIG. 9 illustrates another embodiment of an electroplating process to fill multiple openings in the substrate. As shown, a blanket electrode 50' (metal sheet, bus bar) can be positioned over the surface 42' of the metal layer 36'. A current from the electrode 50' to the plug layer 32' causes metal from the plating solution 54' to deposit onto the plug layers 32' in each of the openings 24' to form the conductive contacts 40'.

Electroplating solutions are known and commercially available. The solution can comprise a conventional electroplating solution, including a metal sulfate solution and acids, commercially available, for example, from Shipley Company, LLC of Marlborough, Mass., Pac Tech USA, Inc. of Santa Clara, Calif., or Enthone OMI (Ethone, Inc., West Haven, Conn.). For example, in a copper electroplating process, the solution can comprise copper sulfate. In an example of a silver electroplating process, the substrate is immersed in a bath comprising a commercially available silver plating bath, for example, a cyanide-free silver plating solution comprising silver succinimide ($C_4H_5O_2NAg$), commercially under the trade name Techni-Silver CY-LESS® L2 from Technic, Inc., Cranston, R.I.

In another embodiment, the metal fill 40 within the openings 24 can be deposited by an electroless plating process, as described hereinabove. For example, the backside of the substrate and metal layer 36 can be sealed within a container 44 as described with reference to FIG. 7, without an electrode contact 50 against the metal layer 36. The sealed container-substrate unit 62 (without electrode 50) can then be submersed into an electroless plating solution for a time period effective to plate a metal layer 58 onto the plug layer 32 and fill the opening 24 to form the contact 40. Plating can be readily conducted in batch by immersing multiple units 62 (without electrode) into the plating solution.

Figure 10:
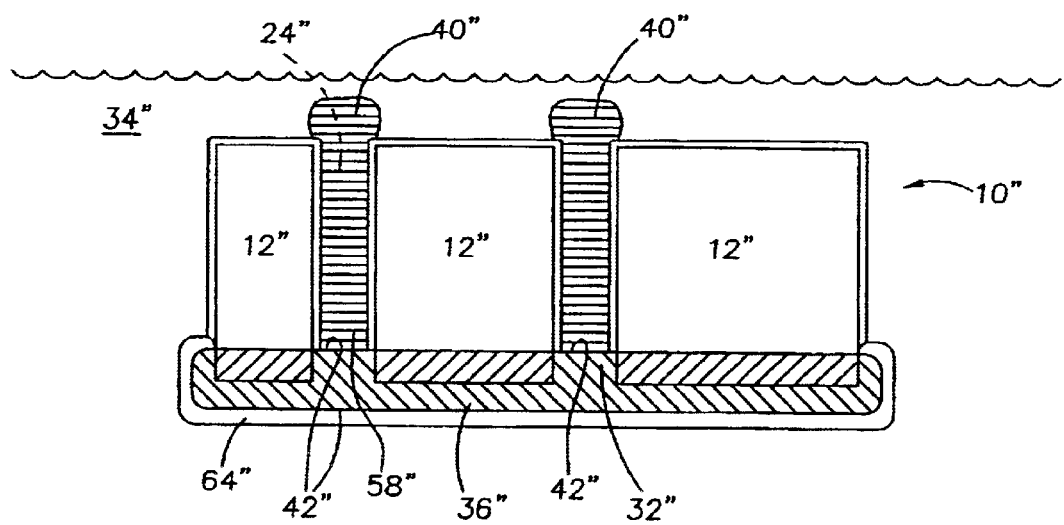
FIG. 10 illustrates another embodiment of a process step to fill the via opening according to the invention, using an electroless plating technique to form the conductive contacts.

In another example of an electroless plating process shown in FIG. 10, a flexible tape or other cover material 64" can be applied to seal the surface 42" of the metal layer 36" from contact with the electroless plating solution 34". The taped substrate can be submerged in the plating bath 34" whereupon metal 58" from the solution will plate onto exposed surfaces 42" of the metal layer, including the plug layer 32" to fill the opening 24" and form the conductive contacts 40".

Figure 11:
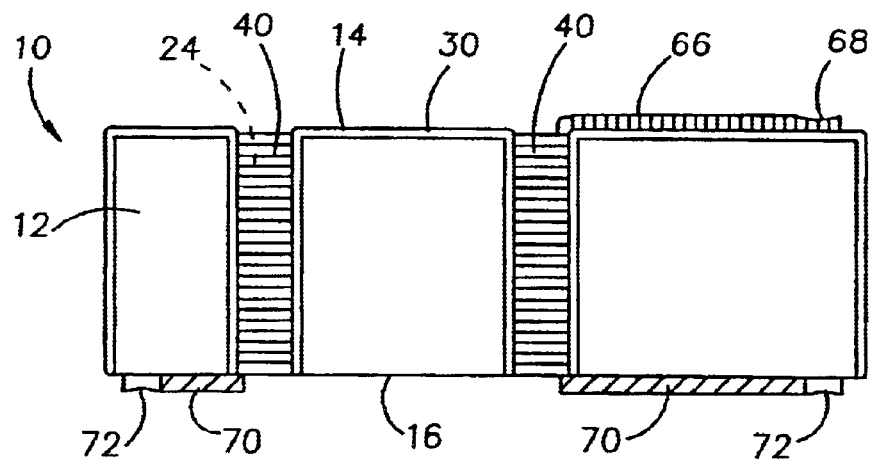
FIG. 11 is a cross-sectional view of the wafer fragment after formation of conductive contacts and processing steps to remove excess metal and form circuit traces on the substrate.

Referring now to FIG. 11, after formation of the contacts 40, the device 10 is removed from the bath, and excess of the metal fill can be removed according to known methods in the art. Unwanted surface metal can be removed to expose the isolation layer 30 while leaving the desired metal within the opening 24 as depicted. Exemplary methods of removing metal material include a conventional dry etch or chemical mechanical polishing (CMP). The finished construction includes a conductive contact 40 formed within the opening 24.

Optionally, as also depicted, circuit traces 66 or other interconnects and contact structures can be fabricated on the isolation layer 30 to couple the via contact 40 to contact pads 68 or other conductive structures, and/or to circuit devices such as a internal circuitry and/or a microprocessor, for example. In addition, the metal layers 18, 36 on the backside of the substrate 12 can be removed by CMP, etching or other process, or patterned as shown to define circuit traces 70 leading from the via contact 40 to contact pads 72, as shown. The conductive contacts 40 can thus connect contact pads 68 on the top surface 14 of the substrate 12 to a conductive element shown as a contact pad 72 on the bottom surface 16 of the substrate.

The substrate 12 can be designed as an interposer for connecting semiconductor devices, including flip-chips, chip scale packages and ball grid array packages to a substrate, such as a test substrate or a higher level carrier substrate. The contact pads 68, 72 on the interposer substrate can be arranged in a pattern that corresponds to that of contact pads on a test or carrier substrate to be connected, or arranged in a different pattern than the bond pads and, therefore, reroute the bond pads of the test or carrier substrate.

Subsequent processing may then be conducted on semiconductor device structure 10, as known in the art.

Figure 12:
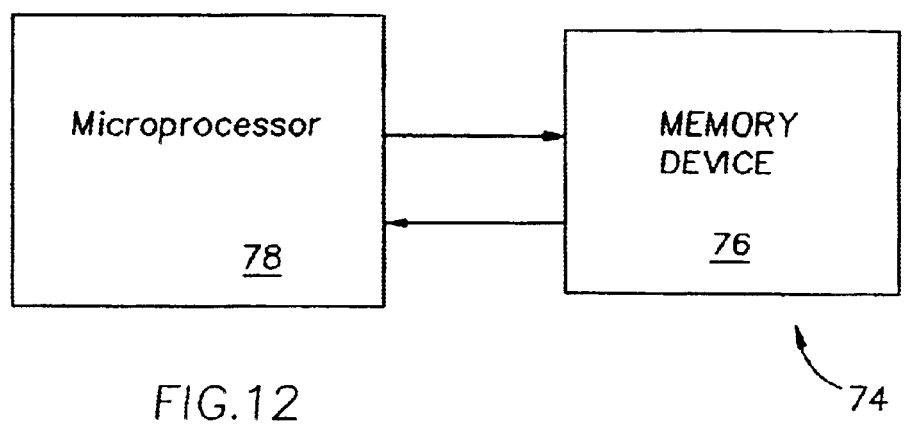
FIG. 12 is a block diagram of an embodiment of a system in which the conductive through-vias of the invention can be used.

FIG. 12 illustrates an embodiment of a system 74 in which the present invention can be incorporated. The system includes a memory device 76 (e.g., static random access memory (SRAM), dynamic random access memory (DRAM), etc.) comprising a conductive contact according to the invention. The memory device 76 is coupled to a microprocessor 78, which may be programmed to carry out particular functions as is known in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact, comprising the steps of:
    applying a layer of metal onto a first surface of a substrate;
    forming an opening through the substrate and the metal layer;
    electroless plating a metal to fill the opening through the metal layer; and
    plating a metal to fill the opening in the substrate.

2. A method of forming a conductive contact, comprising the steps of:
    applying a layer of metal onto a first surface of a substrate;
    forming an opening through the substrate and the metal layer;
    electroless plating a metal to fill the opening through the metal layer; and
    electroplating a metal onto the electroless plated metal fill to form the conductive contact within the opening in the substrate.

3. A method of forming a conductive contact in a substrate, comprising the steps of:
    applying a layer of metal onto a first surface of a substrate;
    forming an opening through the substrate and the metal layer;
    electroless plating a metal to fill the opening through the metal layer; and
    electroless plating a metal to fill the opening in the substrate.

4. A method of forming a conductive contact, comprising the steps of:
    applying a layer of metal onto a first surface of a substrate by a process selected from the group consisting of chemical vapor deposition, physical vapor deposition, evaporation, and plating;
    forming an opening through the substrate and the metal layer;
    electroless plating a metal to fill the opening through the metal layer; and
    plating a metal within the opening in the substrate to form the conductive contact.

5. The method of claim 4, wherein the step of applying the metal layer comprises applying a metal selected from the group consisting of copper, nickel, palladium, platinium, silver, and aluminum.

6. A method of forming a conductive contact, comprising the steps of:
    adhering a metal layer onto a first surface of a substrate;
    forming an opening through the substrate and the metal layer;
    electroless plating a metal to fill the opening through the metal layer; and
    plating a metal to fill the opening in the substrate.

7. The method of claim 6, wherein the metal layer comprises a metal foil.

8. A method of forming a conductive contact, comprising the steps of:
    applying a layer of metal to a first surface of a substrate, the metal layer having a thickness this is a portion of a predetermined radius of an opening to be formed through the metal layer;
    forming the opening through the substrate and the metal layer;
    electroless plating a metal to fill the opening through the metal layer; and
    plating a metal to fill the opening in the substrate.

9. The method of claim 8, wherein the thickness of the metal layer is about 0.2 $\mu$m to about 2 $\mu$m.

10. A method of forming a conductive contact, comprising the steps of:
    depositing a metal onto a first surface of a substrate to a thickness of about one-tenth of a specified radius of an opening to be formed through the metal layer;
    forming the opening through the substrate and the metal layer;
    electroless plating a metal to fill the opening through the metal layer; and
    plating a metal to fill the opening in the substrate.

11. A method of forming a conductive contact, comprising the steps of:
    applying a layer of metal onto a first surface of a substrate;
    forming an opening through the substrate and the metal layer by a process selected from the group consisting of laser etching, dry etching, and photoelectrochemical etching;
    electroless plating a metal to fill the opening through the metal layer; and
    plating a metal to fill the opening in the substrate.

12. A method of forming a conductive contact, comprising the steps of:
applying a layer of metal onto a first surface of a substrate;
forming an opening through the substrate and the metal layer;
forming an isolation layer over sidewalls of the substrate within the opening;
depositing metal onto the metal layer by an electroless plating process to seal the opening in the metal layer; and
depositing metal onto the metal seal to fill the opening in the substrate.

13. A method of forming a conductive contact, comprising the steps of:
applying a layer of metal onto a first surface of a substrate;
forming an opening through the substrate and the metal layer;
electroless plating a metal onto the metal layer to seal the opening through the metal layer; and
plating a metal onto the metal seal to fill the opening in the substrate; and
removing metal from a second surface of the substrate above the opening.

14. The method of claim 13, wherein the step of removing the metal comprises a chemical mechanical polishing process.

15. The method of claim 13, wherein the step of removing the metal comprises an etch process.

16. The method of claim 13, further comprising forming a circuit trace on the second surface of the substrate from the conductive contact to an electrically conductive element.

17. The method of claim 13, further comprising the step of forming a circuit trace on the second surface of the substrate from the conductive contact to one or more integrated circuit devices.

18. The method of claim 13, further comprising, the step of patterning the layer of metal on the first surface of the substrate to form circuit traces.

19. A method of forming a conductive contact, comprising the steps of:
applying a layer of metal onto a first surface of a substrate;
forming an opening through the substrate and the metal layer;
depositing a metal to form a metal plug within the opening through the metal layer by an electroless plating process; and
depositing a metal onto the metal plug by a plating process to fill the opening in the substrate.

20. The method of claim 19, wherein the step of depositing the metal to fill the opening in the substrate comprises an electroless plating process.

21. The method of claim 19, wherein the step of depositing the metal to fill the opening in the substrate comprises an electrolytic plating process.

22. The method of claim 19, wherein the substrate comprises a semiconductive material.

23. The method of claim 22, wherein the semiconductive material is selected from the group consisting of monocrystalline silicon, polycrystalline silicon, germanium, silicon-on-glass, and silicon-on-sapphire.

24. The method of claim 22, further comprising, prior to the step of depositing the metal to form the metal plug, the step of forming an isolation layer on sidewalls of the substrate within the opening.

25. The method of claim 24, wherein the step of forming the isolation layer comprises a process selected from the group consisting of chemical vapor deposition, low pressure chemical vapor deposition, rapid thermal nitridation, and spin-on-glass.

26. The method of claim 24, wherein the isolation layer comprises a material selected from the group consisting of oxide, nitride, oxynitride, and glass.

27. The method of claim 26, wherein the isolation layer comprises silicon oxide, silicon nitride, or silicon oxynitride.

28. The method of claim 26, wherein the isolation layer comprises a glass selected from the group consisting of borophosphosilicate glass, phosphosilicate glass, and borosilicate glass.

29. The method of claim 26, wherein the isolation layer comprises an insulating polymeric material selected from the group consisting of bismaleimide triazine (BT) resin, benzocyclobutene, polybenzoxazole, and polyimide.

30. The method of claim 19, wherein the substrate comprises a non-conductive material.

31. The method of claim 30, wherein the non-conductive material is selected from the group consisting of ceramic, polymer resin, glass-filled epoxy resin material and aramid-filled resin.

32. The method of claim 19, wherein the step of depositing a metal to fill the opening in the substrate comprises plating a metal selected from the group consisting of copper, nickel, cobalt, palladium, platinum, and silver.

33. A method of forming a conductive contact, comprising the steps of:
applying a layer of metal onto a first surface of a substrate, the metal selected from the group consisting of copper, nickel, palladium, platinum, silver, and aluminum;
forming an opening through the substrate and the metal layer;
depositing a metal onto the metal layer by electroless plating to seal the opening through the metal layer, the metal selected from the group consisting of copper, nickel, cobalt, palladium, platinum, and silver; and
depositing a metal onto the metal plug by plating to fill the opening in the substrate, the metal selected from the group consisting of copper, nickel, cobalt, palladium, platinum, and silver.

34. A method of forming a conductive contact, comprising the steps of:
applying a layer of metal onto a first surface of a substrate, the metal layer comprising a metal selected from the group consisting of copper, nickel, palladium, platinum, silver, and aluminum;
forming an opening through the substrate and the metal layer;
depositing a metal onto the metal layer by electroless plating to seal the opening through the metal layer, the metal selected from the group consisting of copper, nickel, cobalt, palladium, platinum, and silver; and
depositing the metal of the metal seal by plating to fill the opening in the substrate.

35. A method of forming a conductive contact, comprising the steps of:
applying a layer of metal onto a first surface of a substrate, the metal layer comprising a metal selected from the group consisting of copper, nickel, palladium, platinum, silver, and aluminum;
forming an opening through the substrate and the metal layer; and
electroless plating to deposit a metal to form a metal plug within the opening through the metal layer and a metal fill within the opening in the substrate.

36. A method of forming a conductive contact, comprising the steps of:

applying a layer of metal onto a first surface of a substrate, the metal layer comprising a metal selected from the group consisting of copper, nickel, palladium, platinum, silver, and aluminum;

forming an opening through the substrate and the metal layer; and electroless plating a metal selected from the group consisting of copper, nickel, cobalt, palladium, platinum, and silver, to seal the opening through the metal layer and fill the opening in the substrate.

37. A method of forming a conductive contact, comprising the steps of:

providing a substrate comprising a first surface, a second surface, and a layer of a metal disposed on the first surface;

forming an opening through the substrate and the metal layer;

electroless plating a metal to seal the opening through the metal layer; and plating a metal to fill the opening in the substrate.

38. The method of claim 37, wherein the metal layer disposed on the substrate comprises a physical vapor deposited metal layer.

39. The method of claim 37, wherein the metal layer disposed on the substrate comprises a chemical vapor deposited metal layer.

40. The method of claim 37, wherein the metal layer disposed on the substrate comprises a plated metal layer.

41. The method of claim 37, wherein the metal layer disposed on the substrate comprises a metal foil adhered to the surface of the substrate.

42. The method of claim 37, wherein the metal layer disposed on the substrate comprises a metal selected from the group consisting of copper, nickel, palladium, platinum, silver, and aluminum.

43. A method of forming a conductive contact, comprising the steps of:

applying a layer of metal onto a first surface of a semiconductive substrate;

forming an opening through the semiconductive substrate and the metal layer;

forming an isolation layer over sidewalls of the semiconductive substrate within the opening;

electroless plating a metal to seal the opening through the metal layer; and plating a metal within the opening in the semiconductive substrate to form the conductive contact.

44. The method of claim 42, wherein the semiconductive substrate is selected from the group consisting of monocrystalline silicon, polycrystalline silicon, germanium, silicon-on-glass, and silicon-on-sapphire.

45. The method of claim 42, wherein the isolation layer comprises a material selected from the group consisting of oxide, nitride, oxynitride, and glass.

46. The method of claim 45, wherein the isolation layer comprises silicon oxide, silicon nitride, or silicon oxynitride.

47. The method of claim 45, wherein the isolation layer comprises a glass selected from the group consisting of borophosphosilicate glass, phosphosilicate glass, and borosilicate glass.

48. The method of claim 43, wherein the isolation layer comprises an insulating polymeric material.

49. The method of claim 45, wherein the polymeric material is selected from the group consisting of bismaleimide triazine (BT) resin, benzocyclobutene, polybenzoxazole, and polyimide.

50. A method of forming a conductive contact, comprising the steps of:

applying a layer of metal onto a first surface of a non-conductive substrate;

forming an opening through the substrate and the metal layer;

electroless plating a metal to seal the opening through the metal layer; and plating a metal within the opening in the substrate to form the conductive contact.

51. The method of claim 50, wherein the substrate comprises a non-conductive material selected from the group consisting of ceramic, polymer resin, glass-filled epoxy resin material, and aramid-filled resin.

* * * * *